(12) United States Patent
Beierlein

(10) Patent No.: US 6,433,358 B1
(45) Date of Patent: Aug. 13, 2002

(54) METHOD FOR PRODUCING AN ORGANIC LIGHT EMITTING DEVICE (OLED) AND OLED PRODUCED THEREBY

(75) Inventor: Tilman A. Beierlein, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 09/658,937

(22) Filed: Sep. 11, 2000

(51) Int. Cl.[7] .......................... H01L 35/24; H01L 51/00
(52) U.S. Cl. ............................................. 257/40; 257/103
(58) Field of Search .................................. 257/40, 103

(56) References Cited

U.S. PATENT DOCUMENTS

| | | | |
|---|---|---|---|
| 4,356,429 A | * | 10/1982 | Tang |
| 4,839,303 A | * | 6/1989 | Tully et al. |
| 5,218,216 A | * | 6/1993 | Manabe et al. |
| 5,247,190 A | * | 9/1993 | Friend et al. |
| 5,633,527 A | * | 5/1997 | Lear |

* cited by examiner

Primary Examiner—Stephen D. Meier
(74) Attorney, Agent, or Firm—Marian Underweiser, Esq.; McGinn & Gibb, PLLC

(57) ABSTRACT

An organic light emitting device (and a method for producing the device) includes a multilayered structure with a substrate layer providing a first electrode layer, a second electrode layer and at least one light emitting organic material layer between the first and second electrode layers. The second electrode layer includes at least two separate layers. That is, a semi-transparent metal electrode layer and a light transparent lateral conductor layer is deposited onto the light emitting organic material layer by depositing the semi-transparent metal electrode layer onto the light emitting organic material layer, depositing subsequently at least one protection layer thereupon and depositing the light transparent lateral conductor layer onto the protection layer.

3 Claims, 1 Drawing Sheet

METHOD FOR PRODUCING AN ORGANIC LIGHT EMITTING DEVICE (OLED) AND OLED PRODUCED THEREBY

BACKGROUND OF THE INVENTION

1. Field of the Invention

The present invention relates to a method (and structure produced thereby) for producing an organic light emitting device, such as organic light emitting diodes (OLEDs), a multi-color display and the like, having a multilayered structure with a substrate layer providing a first electrode layer, a second electrode layer, and at least one layer of light emitting organic material between the first and second electrode layers.

2. Description of the Related Art

Organic light emitting diodes (OLEDs) are an emerging technology with potential applications as discrete light emitting devices, or as the active element of light emitting arrays or displays, such as flat-panel displays. OLEDs are devices in which a stack of organic layers is sandwiched between two electrodes. At least one of the electrodes must be transparent in order for light, which is generated in the active region of the organic stack, to escape.

OLEDs emit light which is generated by organic electroluminescence (EL). Organic EL at low efficiency was observed many years ago in metal/organic/metal structures as, for example, reported in Pope et al., Journal Chem. Phys., Vol. 38, 1963, pp. 2024, and in "Recombination Radiation in Anthracene Crystals", Helfrich et al., Physical Review Letters, Vol. 14, No. 7, 1965, pp. 229–231.

Recent developments have been spurred largely by two reports of high efficiency organic EL. The two reports include C.W. Tang et al., "Organic Electroluminescent Diodes", Applied Physics Letters, Vol. 51, No. 12, 1987, pp. 913–915, and Burroughes et al., "Light-emitting Diodes Based On Conjugated Polymers", Nature, Vol. 347, 1990, pp. 539–541. Tang et al. made two-layer organic light emitting devices using vacuum deposited molecular dye compounds, while Burroughes used spin coated poly (p-phenylenevinylene) (PPV), a polymer.

A standard organic light emitting diode (OLED) consists of a glass substrate covered with a transparent electrode (usually indium-tin oxide ITO) and one or more organic thin layers and a metal top contact. This type of diode is described in U.S. Pat. No. 5,247,190 (Friend et al.), U.S. Pat. No. 4,356,429 (Tang et al.) and in the above-mentioned articles of Tang et al. and Burroughes et al.

Using this type of OLEDs for display applications requires an external driving circuit chip and complex wirings and bondings. These problems are not present, if the organic display is integrated on its own driving circuit which provides the bottom electrodes for each pixel. Therefore, the electrode layer deposited on a substrate has a multitude of single metal pads each defining an electrode for a pixel of the display. Attempts to realize such surface emitting diode structures have been described for example in Parker et al., Appl. Phys. Lett., Vol. 64, No. 14, 1994, pp. 1774–1176 and Baigent et al., Appl. Phys. Lett., Vol. 65, No. 21, 1994, pp. 2636–2638.

The organic layers are deposited on top of the structured electrode, and the display is completed with a common top electrode. In this case, a transparent top electrode is necessary, because generally the substrate with the driving circuit is opaque. However, the deposition of such a transparent lateral conductor (TLC) causes problems, especially for large area organic light emitting displays for the following reasons.

First, today the best known material for a transparent lateral conductor is the above-mentioned indium-tin oxide (ITO). This material is generally sputter deposited. However, this relatively aggressive sputter process damages the underlying organic materials or even shorts to the bottom electrode.

Secondly, commonly-used transparent lateral conductors are metal oxides. During evaporation of suitable metals under an oxygen-rich atmosphere, the organic materials are likely to degrade.

Thirdly, alternative suitable materials for transparent lateral conductors and processes which can be deposited very gently and can exhibit high transmittance and high conductivity are unknown.

Fourthly, a thin semi-transparent metal electrode (TME) could be used for small areas of such kinds of large area displays. But for large areas, this semi-transparent metal electrode is not conductive enough to supply the high current needed to illuminate all pixels. For the pixels in the middle of the display, a tremendous voltage drop will occur in the thin metal electrode and higher voltages must be applied to reach same brightness. However, making the semi-transparent metal electrode thicker would result in unacceptably high absorption of the light and consequently lead to a significantly reduced luminous inefficiency of the device.

SUMMARY OF THE INVENTION

In view of the foregoing and other problems, disadvantages, and drawbacks of the conventional methods and structures, an object of the present invention is to provide a structure (and method) which allows the fabrication of devices without damaging the light emitting areas, but while providing a high lateral conductivity and a high transparency.

It is another object of the present invention to provide a new and improved method for production of an organic light emitting device, array and display based thereon by avoiding the above-mentioned disadvantages.

It is yet another object of the present invention to provide organic light emitting devices having a large light emitting area of uniform brightness, a long service life, and easy and low-cost manufacturing of the same.

In a first aspect of the present invention, a method (and structure produced thereby) is provided for producing an organic light emitting device having a multilayered structure with a substrate providing a first electrode layer, a second electrode layer and at least one layer of light emitting organic material between the first and second electrode layers. The second electrode layer includes at least two separate layers including a layer of a semi-transparent metal electrode (TME) and a layer of transparent lateral conductor (TLC). The semi-transparent metal electrode layer is deposited onto the light emitting organic material layer. At least one light transparent layer being not light emitting is deposited on the semi-transparent metal electrode (TME), to provide protection against the effects of a subsequent deposition of the light transparent conductive material layer (the transparent lateral conductor (TLC)).

The protection layer shields the light emitting organic material layer and the semi-transparent metal electrode (TME) from damage caused by the deposition process such as sputtering or evaporation of ITO under an oxygen atmosphere.

The protection layer may be formed generally of transparent insulators or semiconductors such as GaN, AlN, SiN or other nitrides, or CaF, MgF or other fluorides, or photoresists or epoxy resins. Besides using indium-tin oxide (ITO) for the transparent lateral conductor (TLC), InGaN, InO or other transparent and conductive metal oxides are also applicable.

In a second aspect of the invention, based on the underlying inventive idea of providing a protection layer, the present invention provides a method for producing a surface emitting, large area organic multi-color display.

In this aspect, at the surface of a substrate, the first electrode layer is deposited in a structured manner, as described above, for rendering a multitude of electrode pads defining the areas of light emitting pixels of the device. A stack of layers of organic material is deposited upon the first electrode covering both the electrode pads as well as the non-covered regions of the substrate.

Onto the upper surface of the organic material, a conductive material layer is applied such as a thin layer of a semi-transparent metal electrode (TME). This layer acts as the top carrier injection contact to the organic layers and must supply only the current for one single pixel.

On top of the semi-transparent metal electrode, a first protection layer made of GaN, AlN, SiN or other nitrides or CaF, MgF or other fluorides, is deposited homogeneously and covers the whole surface. On top of this first protection layer and the semi-transparent metal electrode, a second protection layer in a patterned manner is deposited. The second protection layer, which is made of a photoresist material or epoxy resin and therefore suitable for photolithography or other methods of patterning, is patterned such that the light emitting areas, which are each defined by the areas of each electrode pad in the first electrode layer, of the display (pixels) are covered with the material. The space in-between the pixels is only covered by the first protection layer.

In the subsequent sputtering or evaporation step for depositing, the transparent lateral conductor made of, for example, ITO, the lighting areas (e.g., pixel areas) are covered and protected by the first and second protection layers. The areas between the transparent lateral conductors must form a contact with the semi-transparent metal electrode. Thus, the thin, first protection layer is made either conductive or the deposition process of the transparent lateral conductor penetrates the first protection layer such that a contact with the semi-transparent metal electrode occurs.

With the inventive method, a highly, transparent common top electrode can be deposited without damaging the areas of the active organic layers. The electrical contact from the transparent lateral conductor to the lighting pixel area is made via the space between the pixels where the TLC contacts the semi-transparent metal electrode. With this process, large area displays can be fabricated, because the semi-transparent metal electrode is highly transparent and sufficiently thick enough to supply enough current for one pixel. The high current density occurs in the thick transparent lateral conductor which supplies current for the entire display.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
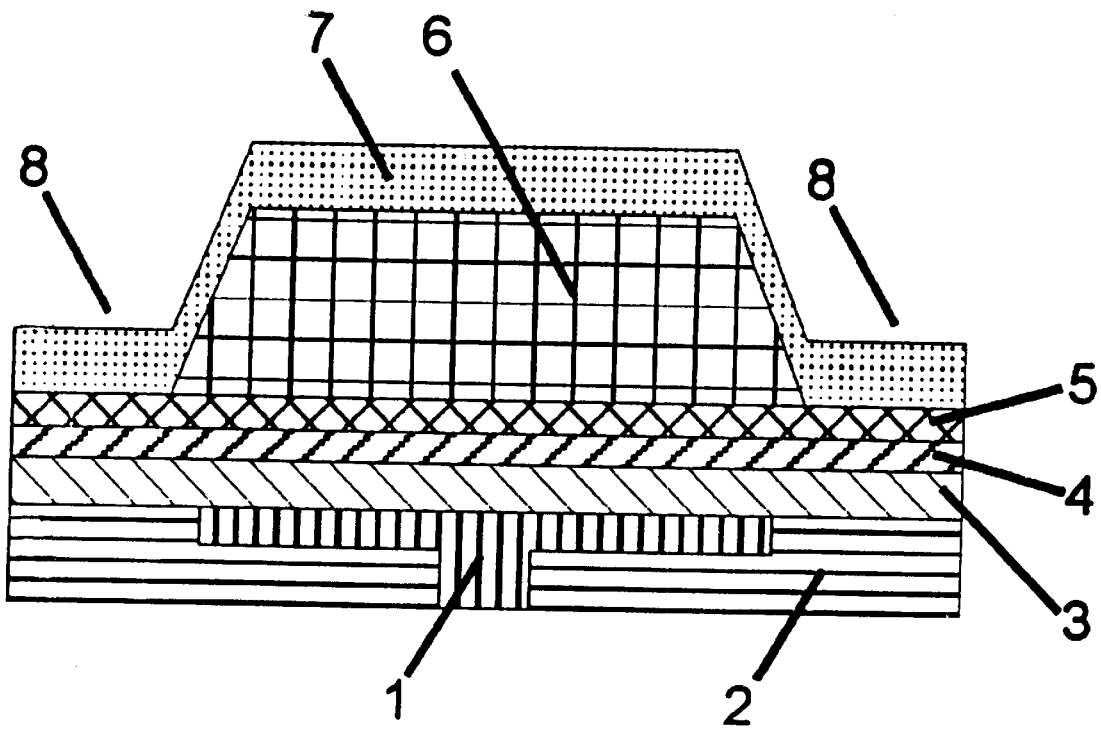
FIG. 1 illustrates a cross-section of a pixel element of an organic display.
Figure 2:
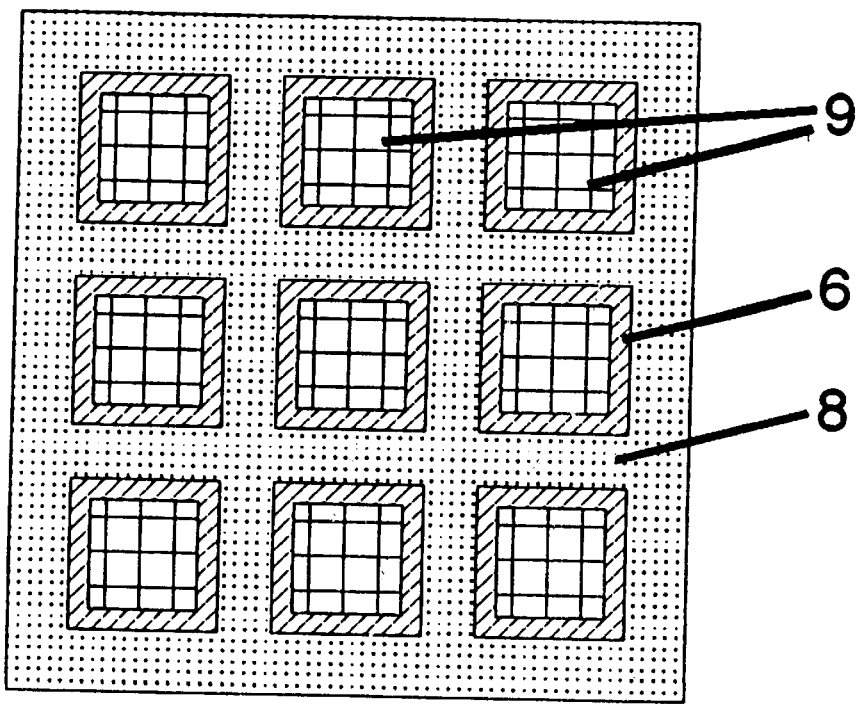
FIG. 2 illustrates a plan view of an array of several pixel elements.

Referring now to the drawings, and more particularly to FIGS. 1–2, preferred embodiments of the method and structures according to the present invention will be described.

FIG. 1 shows an exemplary cross-section of a pixel element of an organic display. The pixel of an organic display is defined by an electrode pad 1 made of metal which acts as the anode.

The electrode pad 1 is integrated into the surface of the substrate 2 and connected to the integrated driving circuit (not shown). A stack of organic layers 3 are successively deposited on top of the substrate 2 covering also the electrode pad 1 and completed with a 5-nm thin layer 4 of Ca being the cathode and representing the layer of conductive material 4 (e.g., also called "the semi-transparent metal electrode (TME)"). A 20-nm GaN film 5 is deposited to protect the Ca layer 4 from oxidation and the subsequent deposition process of the second protection layer.

A photoresist 6 is formed (e.g., spun) on the GaN film 5, and structured, so that an area larger than that defined by the anode electrode pad 1 will remain covered with resist 6. The thin transparent resist 6 prevents plasma damage of the lighting areas caused by the subsequent ITO sputter process which forms a layer 7 of ITO thereon. In the regions 8 not covered by resist 6, the ions during the sputtering step penetrate the thin GaN film 5 and the ITO layer 7 is in contact with the Ca layer 4.

FIG. 2 illustrates a plan view of an array of several pixel elements, in which the arrangement of the separated pixel elements is shown. The size of each pixel element is defined by the area of the electrode pads 1 (e.g., shown in FIG. 1 and which are the light emitting areas 9). The light emitting areas 9 are overlapped by the second protection layer such as the photoresist layer 6. In the areas 8 between each pixel, the ITO layer 7 (e.g., also called a "transparent lateral conductor") is in electrical contact with the thin metal electrode 5.

Regarding the specifications of the first and second protection layers and also the transparent lateral conductor, preferably the following properties are met.

That is, the first protection layer is preferably made of a material which is highly transparent, conducting or isolating. For an isolating material perpendicular to the surface of the layers, then the deposition process of the transparent lateral conductor must be chosen, so that the transparent lateral conductor forms a contact with the semi-transparent metal electrode (TME) (e.g., by sputtering or the like). Useful materials are GaN, AlN, SiN and other nitrides, and/or CaF, MgF or other fluorides.

Preferably, in depositing the first protection layer onto the semi-transparent metal electrode (TME), damage to the TME or the underlying organic layers is avoided. Suitable deposition techniques are plasma enhanced molecular beam deposition, thermal evaporation, chemical vapor deposition, etc.

The material of the second protection layer includes a highly transparent and easily patternable material such as a photoresist or epoxy resin material. Suitable kinds of processes include spin-coating, spraying, dipping, etc. Additionally, a material can be used which has a matched refractive index, and is formed like a lens for enhanced light output.

The material of the transparent lateral conductor (TLC) preferably is highly transparent and highly conductive, and some candidate materials are ITO, InGaN, InO, etc. The deposition process must avoid damage to the organic material underneath the second protection layer, which is within that area which is defined by the bottom electrode and covered with the second protection layer. Useable deposition processes are sputtering and evaporation.

While the invention has been described in terms of several preferred embodiments, those skilled in the art will recognize that the invention can be practiced with modification within the spirit and scope of the appended claims.

Having thus described my invention, what I claim as new and desire to secure by Letters Patent is as follows:

1. An organic light emitting device (OLED) having a multilayered structure, comprising:

a substrate layer providing a first electrode layer;

a second electrode layer; and at least one layer of light emitting organic material between said first and second electrode layers, wherein said first electrode layer provides a plurality of single electrode pads each spaced apart from each other situated in or on said substrate layer, said at least one light emitting organic material layer covering exhaustively said first electrode layer and being covered with a semi-transparent metal electrode layer, wherein said semi-transparent metal electrode layer includes a protection layer deposited thereonto, said protection layer having a transparent lateral conductor layer applied thereto.

2. The device of claim 1, wherein said protection layer includes first and second protection layers, said first protection layer covering a surface of said semi-transparent metal electrode layer, exhaustively and said second protection layer being deposited on said first protection layer and providing separated regions overlapping each of said electrode pads.

3. The device of claim 2, wherein said first protection layer comprises at least one of a nitride and a fluoride, and said second protection layer comprises at least one of a photoresist and an epoxy resin.

* * * * *